United States Patent [19]

Kuehnle et al.

[11] 4,204,865

[45] May 27, 1980

[54] DIRECT-IMAGING FLEXIBLE OFFSET PRINTING PLATE AND METHOD OF MANUFACTURE

[75] Inventors: Manfred R. Kuehnle, Lexington; Ferdinand Martinez, Belmont; Stanley F. Ignasiak, Holliston, all of Mass.

[73] Assignee: Coulter Systems Corporation, Bedford, Mass.

[21] Appl. No.: 870,675

[22] Filed: Jan. 19, 1978

Related U.S. Application Data

[63] Continuation of Ser. No. 632,590, Nov. 17, 1975, abandoned.

[51] Int. Cl.[2] .......................... G03G 5/04; G03F 7/02

[52] U.S. Cl. .......................... 430/30; 96/1.5; 96/33; 101/465; 101/463.1; 430/56; 430/302

[58] Field of Search .......................... 96/1 R, 1.5, 33; 101/463, 465, 453, 460

[56] References Cited

U.S. PATENT DOCUMENTS

| | | | |
|---|---|---|---|
| 3,309,990 | 3/1967 | Klüpfel et al. | 101/149.2 |
| 3,460,476 | 8/1969 | Swigert et al. | 101/450 |
| 3,547,627 | 12/1970 | Amidon et al. | 96/1 R |
| 3,607,255 | 9/1971 | Back | 96/1 R |
| 3,697,268 | 10/1972 | Ohta | 101/465 |
| 3,907,562 | 9/1975 | Crystal | 96/1 R |
| 3,926,762 | 12/1975 | Goldstein | 96/1.5 |
| 4,025,339 | 5/1977 | Kuehnle | 96/1.5 |

FOREIGN PATENT DOCUMENTS

| | | | |
|---|---|---|---|
| 257220 | 2/1961 | Australia | 101/465 |

OTHER PUBLICATIONS

Lagnado et al. RF—Sputtered Cds.—Thin Crystals p. 318-321, J. of Vacuum Sci. & Tech. Mar.; 1970.

*Primary Examiner*—D. Travis Brown

*Attorney, Agent, or Firm*—Silverman, Cass & Singer, Ltd.

[57] ABSTRACT

A flexible offset printing plate is formed from a directly imaged electrophotographic member comprising an inorganic coating of a photoconductive material on a polyester substrate. The photoconductive material is an oriented crystalline deposit about 3000 Angstroms thick which has been directly sputtered with radiofrequency energy in a process using a Langmuir sheath to produce a light sensitive, readily imaged abrasion-resistant, transparent coating. It is deposited on a sheet of dimensionally stable, transparent polyester film having a thickness of about 0.005 inch with an intervening sandwiched layer of ohmic material such as indium-tin oxide about 300 Angstroms thick. The transparency of the ohmic layer and the photoconductive coating on a transparent substrate result in a transparent plate.

The electrophotographic member is imaged by charging, exposure and toning with a suitable toner. The non-imaged parts of the surface are rendered hydrophilic (having a strong affinity for water and repellant to greasy ink) by suitable chemical and/or mechanical treatment while the imaged and toned parts are rendered hydrophobic (water-repellant and having a strong affinity for greasy ink). This may simply comprise choosing a type of toner which is inherently hydrophobic. The plate is mounted in an offset press and printing effected as though it were a conventional offset plate using the usual grease- or oil-based inks.

35 Claims, 3 Drawing Figures

DIRECT-IMAGING FLEXIBLE OFFSET PRINTING PLATE AND METHOD OF MANUFACTURE

This is a continuation of application Ser. No. 632,590 filed Nov. 17, 1975, now abandoned.

CROSS-REFERENCE TO COPENDING APPLICATION

The details of the electrophotographic member which is used in the production of the printing plate of the invention are disclosed in a copending application owned by the assignee of this application. The title is "ELECTROPHOTOGRAPHIC FILM, METHOD OF MAKING AND USING THE SAME AND PHOTOCONDUCTIVE COATING USED THEREWITH." The Ser. No. is 434,699 and the filing date is Jan. 18, 1974 said application now abandoned in favor of U.S. Continuation Application Ser. No. 704,780 filed July 13, 1976 which matured into U.S. Pat. No. 4,025,339 on May 24, 1977.

BACKGROUND OF THE INVENTION

This invention is concerned generally with the production of a flexible, direct-imaging lithographic printing plate which is highly effective and yet more economical than most known lithographic plates. The particular thrust of the invention is to the achievement of a direct imaging plate which is to be used in offset printing and which can be discarded after one use, if desired because it is so economical to make.

Lithographic printing is a very old and well-known process in which the image is applied to a surface where the non-imaged portion of the surface is rendered hydrophilic while the image is hydrophobic. When inked with greasy inks, the image attracts the ink while the remainder of the surface repels it. The paper receptor is pressed against the surface and picks up only the inked image.

Thus, lithography is a printing process in which a planographic method is used, that is, the printing image and the non-printing areas all lie in substantially the same plane.

Offset lithography is probably the most important method of printing today. The principle is that ink is offset first from the plate to a rubber blanket and then from the blanket to the paper receptor. There may be an intervening metal drum instead of a rubber blanket. When the printing plate is made, the printing image is rendered hydrophobic, i.e., repellant to water but also attractive to grease. The non-printing areas are rendered just the opposite, that is, hydrophilic. On the press the plate is mounted on a plate cylinder which, as it rotates, comes into contact successively with rollers wet by a water or dampening solution and rollers wet by grease-based ink. The dampening solution wets the nonprinting areas of the plate and prevents the ink from wetting these areas. The ink wets the image areas which are transferred to the intermediate blanket cylinder. The paper picks up the image as it passes between the blanket cylinder and the impression cylinder.

Offset plates of conventional construction of the type expected to make many thousands of impressions are expensive to manufacture. Ink receptivity is accomplished by using inherently oleophilic (having an affinity for oil) resins or metals like copper or brass on the image areas. Water receptivity of the non-image areas is usually achieved by using hydrophilic metals like chromium, aluminum or stainless steel and this receptivity is maintained in platemaking and storage by using natural and synthetic gums such as for example, gum arabic.

All offset printing plates which are used for long runs exceeding several thousands of impressions are made by indirect imaging methods. The copy or intelligence is first required to be photographed onto silver halide film and the film negative then used to transfer the image to the printing plate. The transfer is accomplished in all such cases by means of photographic projection onto a coating which is light sensitive and carried by the plate. The negative is used to project the image onto the plate and the processes which follow for the development of the image on the plate vary. Thus, the plates are required to be stored in darkness until used or the light-sensitive coating applied just before use. This is true of the three types of long-run offset plates which are most popularly used today.

The invention herein provides an electrophotographic member which is imaged directly, toned and treated to become a printing plate. Treatment occurs in one or two simple steps that can be considered a single continuing step of several minor parts. The directness and simplicity of the process and the effectiveness of the product are not found in the graphic art, and yet, the durability of the plate of the invention rivals that of the metal plates in use today.

The three types of long run plates which are known at this time are surface, deep etch and bimetal. The surface plates are those in which a light-sensitive coating is exposed to a negative, developed etc. The process of achieving the plate requires many steps and treatments. On deep etch plates, after exposure to the negative, the coating in the image areas is removed and coppered chemically and/or lacquered and inked so they are ink receptive. The plate is usually aluminum and the process is quite involved and requires considerable skill. Bimetal plates are similar to deep etch in that the light sensitive coating is removed from the image areas but these areas consist of copper or brass.

The plates which are known are not transparent and hence cannot be viewed through optical projection. They cannot be readily corrected or added to.

In the case of the plate of the invention, the imaged plate may be washed off before treatment, corrected at that time, reimaged and additional images added with no problem.

One of the most important advantages of the invention is that the cost of a plate for printing is a small fraction of the cost of known lithographic offset plates.

It is known to make a printing plate utilizing zinc oxide as a photoconductive material. This is a somewhat complex structure in which the top layer is zinc oxide in a resin matrix with dyes for sensitizing, the second layer is paper substrate which has been treated with salt and glycerin along with a wet strength additive and the bottom layer is a conductive coating such as a water-soluble resin of the type used to render the paper substrate conductive. This plate has low sensitivity, low resolution, mediocre quality and can be used to make at most 3000 impressions. The material used to make the nonimaged areas hydrophilic is a potassium ferrocyanide.

SUMMARY OF THE INVENTION

A direct-imaging, flexible offset printing plate and method of manufacture are disclosed. The base for the plate is an electrophotographic member comprising a thin, flexible, transparent, dimensionally stable polyester substrate having a thin, transparent ohmic layer deposited thereon and a highly light-sensitive, readily-imaged, crystalline, transparent, abrasion-resistant photoconductive coating sputter-deposited thereon.

The electrophotographic member is charged in darkness, exposed to the light-projected material which it is desired to print, then toned by a toner that is hydrophobic.

Thereafter the toned image may be fixed or not, depending on the manner of treating the article to render the non-imaged areas hydrophilic. In either case the imaged surface is treated by means of a liquid substance that is applied in any suitable manner such as dipping, swabbing, spraying etc. The substance reacts with or mechanically adheres to the non-imaged areas rendering them hydrophilic. The imaged areas are either not affected or affected in a manner which is readily changed so that the imaged areas are hydrophobic.

If the image is not fixed, after treatment it is either washed off by suitable solvents before mounting the plate on a carrier drum of an offset press or mounted on the drum without washing and worn off in the first few impressions made.

If the image if fixed the surface is treated as described and the plate is mounted directly on the carrier drum. Much of the treatment coating as may adhere to the image is worn off in the first few impressions.

Such a plate is directly imaged without the need for expensive intervening processes and eliminates the need for proofs. It is thin and flexible enabling ready storage. It is highly economical and durable. Its transparency enables ready viewing and checking by projection. Until it has been fixed, a toned image can be erased and repeated on the same electrophotographic base. The quality, resolution, grey scale, and panchromaticity are better than any known offset plates. Color separations are readily made and color printing rendered substantially more economical than heretofore.

DESCRIPTION OF THE PREFERRED EMBODIMENTS

Figure 1:
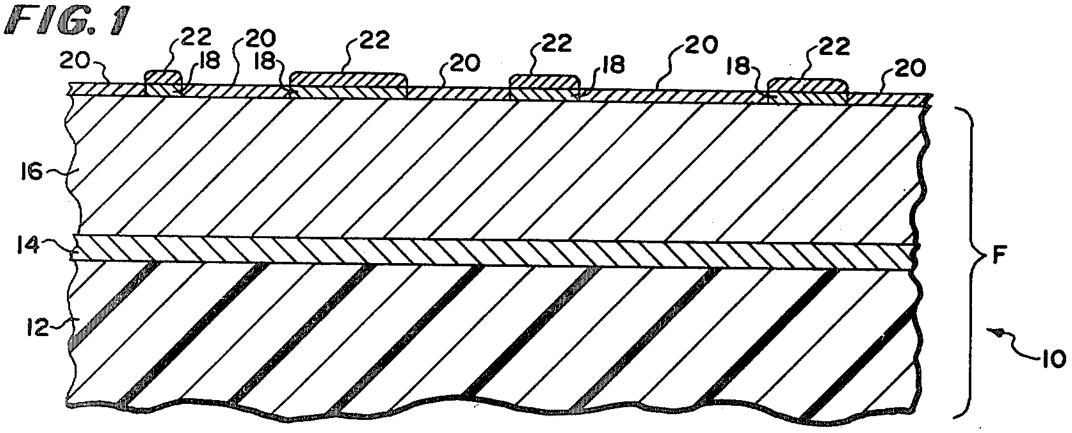
FIG. 1 is a fragmentary sectional view on an exaggerated scale taken through a flexible lithographic printing plate that is made in accordance with the invention.

The manufacture of the plate of the invention commences after the production of an electrophotographic member in accordance with the teachings of the copending application Ser. No. 434,699, now abandoned in favor of Continuation Application 704,780 filed July 13, 1976 which matured as U.S. Pat. No. 4,025,339 on May 24, 1977. The electrophotographic member comprises a structure which may be used for imaging purposes in a wide varity of fields, including for example photography, duplicating, microfilming, enlarging etc.

The electrophotographic member which forms the base for the printing plate of the invention comprises a flexible substrate that is a synthetic resin polymer such as commercially available polyester film carrying an inorganic ohmic layer and an inorganic photoconductive coating on top of the ohmic layer. A typical structure has the substrate formed of transparent polyester sheeting about 0.005 inch thick. One example is polyethylene glycol terephthalate. The sheeting is sputtered on one surface with a layer of indium-tin oxide to a thickness of about 300 Angstroms. The proportions of indium oxide to tin oxide are about nine to one, respectively. This ohmic layer is an aid to charging only, is transparent to a relatively high degree to visible light, and does not impair the flexibility of the substrate. The coating of photoconductive material is applied on top of the ohmic layer by r.f. sputtering in which the targets used are of the chemical substance being sputtered, thus avoiding reactive type sputtering. This achieves excellent stoichiometry. The anode which is used in a preferred process is a rotating drum over which a long length of the ohmic layer bearing substrate is transported continuously. The anode is not maintained at ground potential so that there is in effect a negative bias voltage between the anode and ground giving rise to a second dark space or Langmuir sheath at the anode through which the sputtering of the photoconductive material must take place.

The coating which is laid down is a deposit of uniformly-sized highly oriented crystals of a wholly inorganic photoconductor forming an extremely dense, abrasive-resistant, highly light-sensitive, high gain, electrically anisotropic coating that is typically about 3500 Angstroms thick. The combined transparency of the entire member is between 70 and 85% for visible light.

The preferred photoconductive coating is cadmium sulfide (CdS) because it is substantially panchromatic. Other materials which have been coated successfully by the same method to achieve electrophotographic members that could form the base for the printing plate of the invention are zinc sulfide (ZnS) and arsenic trisulfide ($As_2S_3$). These materials have different spectral responses than cadmium sulfide and are imaged with light which takes best advantage of their spectral properties. Mixtures of these materials have been coated to achieve particular spectral characteristics.

The electrophotographic member is in nowise modified from its originally manufactured form for the purpose of making the printing plate of the invention. The member is thus invested with all of the benefits and advantages inherent in the invention of the copending application. For example, it is almost indestructible and can be stored under any conditions of light, moisture and temperature without any effect. It is flexible, enabling ready mounting and manipulating.

In making the plate of the invention, the electrophotographic member is charged, exposed to a light image and toned. The toned image may be fixed by thermal fusing, if needed. Thereafter the surface is treated by suitable reagents which render the non-imaged areas hydrophilic and the toner hydrophobic. Most toners in use today are inherently hydrophobic before and after fixing. The plate is mounted in the press and the press is set into operation. In an alternate form of the invention, the toner may not be fixed, but is removed by washing after the non-imaged areas have been treated and the plate then run in the press without the presence of toner. In another form, the plate is run in the press without washing and the toner is removed by the first few impressions made.

In FIG. 1 there is illustrated a printing plate 10 of the invention which is constructed in accordance with method of the invention, the same being shown in the process of use. The basic electrophotographic film itself is constituted by the elements 12, 14 and 16, these being, respectively the polyester substrate, the ohmic layer and the photoconductive coating. The electrophotographic film, generally designated F is charged in darkness by suitable corona producing means, imaged by radiation to produce a latent electrostatic image and toned. The toner will adhere to the portions of the surface where the charge has not been dissipated by the projected light image and thereby produce a visible image represented by the toned areas 18 in FIG. 1.

In this condition, the film F is in the form of a transparency with a projectible image. The image may be fixed or removable, depending upon the process which is followed thereafter.

In one successful method, the toner was fixed by thermally fusing it to the surface of the photoconductive coating 16. It should be appreciated that most toners are made out of carbon and/or organic resin particles and are hydrophobic both before and after fusing. The hard crystalline surface of the photoconductive coatings of the films like F are also hydrophobic. Thus, if oil or grease-based ink were applied to the surface it would wet the entire surface, imaged and non-imaged portions alike.

Thereafter, in order to render the non-imaged portions hydrophilic without changing the hydrophobic property of the toned areas, the film surface is coated with a material that reacts with or adheres firmly to the non-imaged areas only. Such a material is shown at 20 in FIG. 1 extending between the toned areas 18. The material 20 may chemically react with the coating 16 to form a compound that is hydrophilic. The plate 10 is now complete. Once installed in an offset press it can be used to print many copies of the image. The ink adheres firmly only to the imaged areas as shown at 22. If any of the material 20 had mechanically adhered to the areas 18, the first few impressions would remove it.

Figure 2:
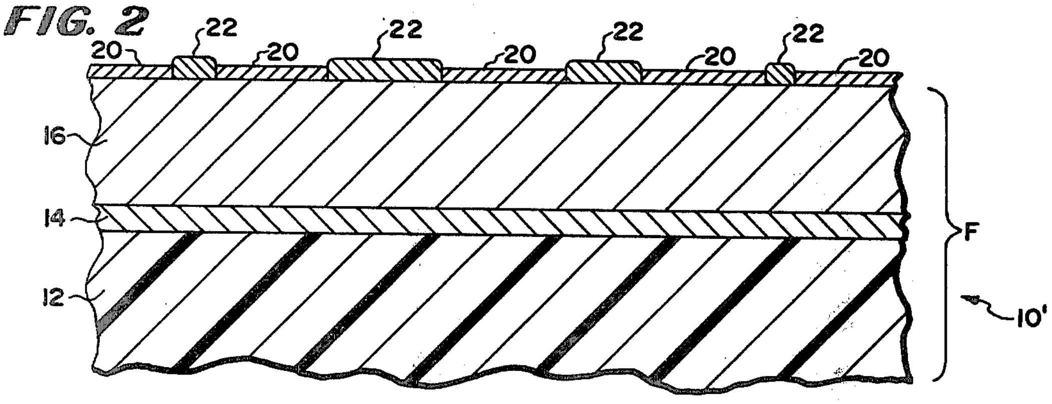
FIG. 2 is a similar view showing a variation of the invention.

Another method of making a plate is by removing the toned image after treatment of the film F. In FIG. 2 the same reference characters are used to designate equivalent elements of FIG. 1. The plate 10' differs from the plate 10 only in the respect that the toner which is used to provide the visible image is of a type which can be easily washed away or "pulled" off the surface of coating 16. Since the surface of the photoconductive coating 16 is naturally hydrophobic, removal of the protective coating represented by the toner exposes the original surface and this readily accepts ink and repels water.

It is emphasized that the dimensions in FIG. 1 and 2 are exaggerated to aid in the explanation.

In FIG. 2, the toned image represented by the toner such as 18 in FIG. 1 has been removed in one of two ways. It may have been washed off by the use of a rinsing or swabbing with a hydrocarbon solvent such as Isopar (Exxon Company) or it may have been removed by being pulled off in a press. In this latter case the plate with soft masking toner applied and not fixed, but treated, is installed in the press. The first few impressions will pull the toned image off, leaving the bare hydrophobic photoconductor surface. Ink fills the resulting spaces, as shown in FIG. 2.

Figure 3:
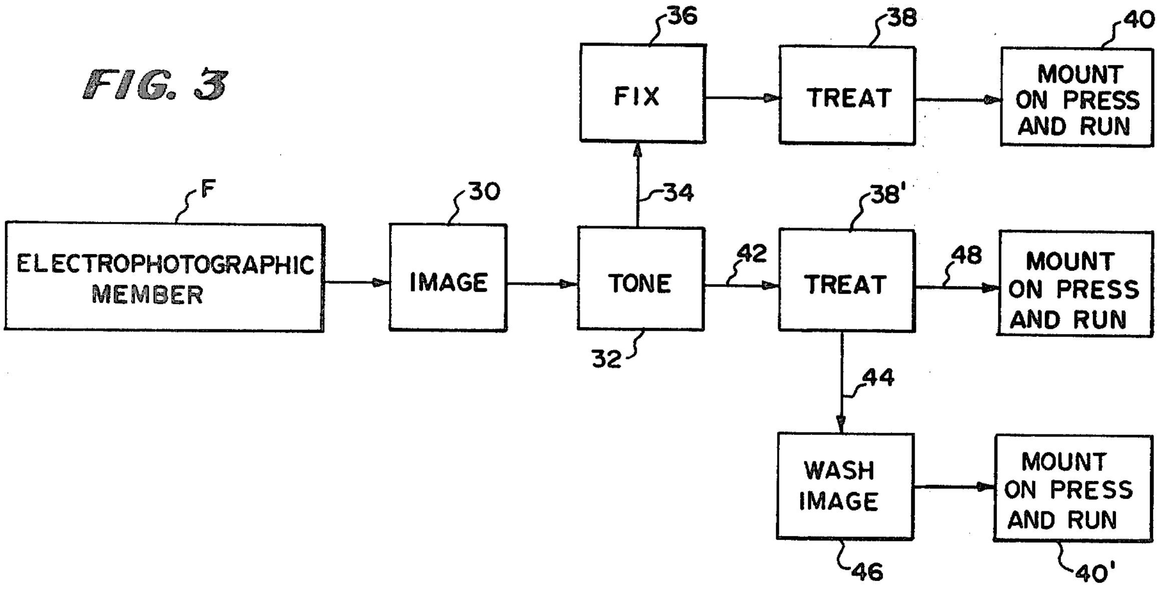
FIG. 3 is a block diagram showing the steps of manufacture of the method of the invention illustrating variations thereof.

The alternate methods are illustrated in the block diagram of FIG. 3. All methods start with the electrophotographic member of film F. The film F is imaged at 30 and toned at 32. One variation of the method follow the arrow 34 and provides for a fixing step at 36 which may comprise thermal fusing. Toners with liquid carriers are available that dry with a practically fixed condition. This is included by reference to "fixing" at 36. Thereafter the treatment for rendering the non-imaged areas hydrophilic takes place at 38. As mentioned, nothing need be done to almost all toners since they are inherently hydrophobic. Then the resulting plate is mounted in the press and run as shown at 40. The first few impressions will clean any treatment material from the toned image. A second method follows arrows 42 and 44. In this case, where a soft masking toner is used, there is no fixing step like 36. After toning the plate is treated at 38' in the identical step as 38, the image washed at 46 to remove the toner and such of the treatment material as may have adhered, and the plate mounted in the press and run as at 40'. The third variation of method follows arrows 42 and 48, the plate being mounted in the press and run at 40" without washing the image.

The materials which are operative with the invention are for the most part freely available commercially. Some of the suggested materials and examples are given below.

As for the toners, for the method exemplified in FIG. 1 a commercial "fusible" toner is used. This is a type of toner, either in powder form or dispersed in a hydrocarbon, which is fused by a heat lamp after deposit. Such toners are available through toner specialty companies or through supply houses furnishing toners for many office duplicating machines in use today and the makers themselves. Typical sources are Philip A. Hunt Chemical Corp., Dennison Copier Corp., Surface Processes Corp. and Imaging Systems Corp., all of the USA. The range of properties of these toners is wide. The same companies can furnish the so-called "soft-masking" toners that do not adhere tenaciously. Even fusible toners can be removed if not fixed. Such toners can be washed off surfaces with suitable solvents, such as Isopar, referred to above. FIG. 2 shows the plate made with such toner.

The treatment materials for rendering the non-imaged surfaces of the plate hydrophilic are of several different types. The following have been used successfully:

- silicate polymers such as sodium silicate, potassium silicate and mixtures in various concentrations;
- sodium aluminum hydorxide complexes;
- commercial etch mixtures containing ferrocyanide, such as for example A. B. Dick etch product used to treat zinc oxide plates;
- polyvinyl alcohol treated to render it insoluble in water.

In some instances where the material that is used to treat the surface adheres to any degree to the toned images, the toned images are best applied with the soft masking toner or any other type of toner which is easily removed after treatment of the surface and will carry the adhered material with it. Plates with fixed images are preferred if multiple uses are planned. Stored plates should be readily identified by their images.

The preferred treatment for the making of a plate is the use of sodium silicate, also known as water glass. This material adheres to the photoconductive coating and forms a glass-like film that is smooth, hard and continuous. The running of a plate made with this coating material will yield many thousands of copies without showing any visible signs of wear or deterioration of the image. The reason for preferential adherence to the photoconductive coating, cadmium sulfide, for example, is not fully known. Sodium silicate is an inorganic polymer comprising long chains of silicate ions connected by sodium ions. It seems to act as a surfactant. It forms a continuous film which is not crystalline when it dries.

It is believed that the silicate polymer does not adhere to the toner because the toner is for the most part organic and not compatible with the aqueous solution of the silicate and/or metasilicate. Thus, oilbased inks will adhere to the toner, but the silicate will not.

Polyvinyl alcohol is soluble in water and forms a soluble film upon evaporation of its water. Such a film is desirable on the surface of the non-imaged areas but is of no value if soluble. If treated with a mixture of boric acid [$H_3BO_3$] and sodium tetraborate [$Na_2B_4O_7$] polyvinyl alcohol can be made water insoluble. It shows preferential adhesion to the non-imaged areas of the surface of the film F and does not adhere as well to the toned images. Its adhesion is not as good as that of the silicate and/or metasilicate material, but many hundreds of impressions can be made before deterioration of the image.

The sodium aluminum hydroxide complex is useful likewise for short runs of a plate. it can be made by intermixing aluminum sulfate [$Al_2(SO_4)_3$] with sodium hydroxide [NaOH]. There will be a precipitate of aluminum hydroxide [$Al_2(OH)_3$] resulting, but if additional sodium hydroxide is added, the precipitate disappears leaving a complex chemical which is probably some form of sodium aluminum hydroxide such as $NaAl(OH)_4$.

EXAMPLE 1

The electrophotographic member was a film made as described above using the polyester substrate, indium-tin oxide ohmic layer of about 300 Angstroms, and a photoconductive coating of cadmium sulfide of about 3000 Angstroms thick. Such a film rinsed in a solution of the sodium aluminum hydroxide complex as described above provided a coating that rejected oil-based inks. A piece of this film, about 19×48 cms, was placed in an A. B. Dick small offset printer and run without an image. The machine passed 5600 impressions without signs of inking on its surface when the plate was removed. There was no sign of wear or that the plate could not continue indefinitely without taking up ink on the surface.

A similar plate about 16×25.4 cm. was imaged by exposure to a test pattern and toned with a toner of the fusible variety and fused. The plate was installed in the same machine and was run for about 1000 impressions before wear of the image was detected.

The treatment solution was made for both plates using the following ingredients, mixed as explained above:

Aluminum sulfate—160 grams in 500 cc of water.

Sodium hydroxide—50 grams in 800 cc of water.

No critical temperatures were necessary.

EXAMPLE 2

An aqueous solution of polyvinyl alcohol having a concentration of between 1% and 2% by weight was coated on a plate, dried and then immersed in a solution of boric acid and sodium tetraborate at room temperature in the following proportions:

Polyvinyl alcohol solution—1000 cc.

Boric acid—30 grams.

Sodium tetraborate—100 grams.

The same plate was used as described in Example 1, imaged in the same manner. The polyvinyl alcohol is applied and dried. Thercafter the plate is dipped into the boric acid/sodium tetraborate solution once or twice, permitting drying between, and thereafter placed on the same A. B. Dick offset press. A run of about 100 impressions was made with little deterioration of the image before the machine was stopped. Some signs of wear were visible on the image of the plate.

The size of the plate was about 16 cm by 25.4 cm.

EXAMPLE 3

The same type of electrophotographic member as in Examples 1 and 2, having the dimensions 25.4 cm. by 33 cm. is imaged using a fusible toner thereafter fused permanently to the surface. An aqueous solution of sodium silicate is prepared having a concentration of 2% by volume of a stock solution which is 40°–42′ Baume. The stock solution is 1.4 grams/cc. The plate was held flat on a steel surface by means of a vacuum apparatus and a cotton swab wetted with the sodium silicate solution was wiped onto the surface carrying the images. Air or heat lamp drying is effected in a few minutes. Placed on the A. B. Dick offset printing press, the plate of this example gave excellent results, being removed after running several thousands of copies with excellent impressions and showing no signs of wear. One test with an identical plate was permitted to produce 40,000 impressions without showing any signs of wear.

EXAMPLE 4

The plate and solution were the same as in Example No. 3 except that the plate was imaged with soft masking toner. The concentration of the sodium silicate was 1.5% by volume. The imaged plate was prepared by submerging it in the solution and then permitting it to air dry. Thereafter the toner was wiped off using a large cotton swab dipped in Isopar G, a hydrocarbon solvent of Exxon Company.

The plate was placed in the A. B. Dick offset printing press and run to produce many thousands of copies of excellent quality without showing signs of wear.

Identical plates were tried without an Isopar wash and, after the first few impressions, gave the same results as Example 4.

Many other examples of application of sodium silicates were tried. Toners used were fusible and soft masking types. Where the latter were used they were either wiped off before running or placed directly in the offset printing press. The silicate solutions tried were concentrations of as little as 0.1% and as much as 5% with no extraordinary criticality noted. The most desirable range appeared to be a concentration between 1% and 2%. Applications were by wiping the material onto the surface or by dipping. A single application was all that was needed, although the thickness of the resulting coating was controlled to a large extent by the number of applications, with drying between each coat. From one to four separate applications were tried successfully.

In addition to commercial toners of the type described, marking pen ink was used as a toner and treated as soft masking toner, that is, wiped off with a solvent before running the plate in the press or permitted to be worn off by running directly.

Scanning electron micrographs and estimates of molecular dimensions indicate that a typical silicate coating is about 700 Angstroms in thickness. This is achieved by three applications of a 0.5% silicate solution or a single application of a 2% solution.

It is pointed out that the basic concept is a plate which is based upon a tough, durable, abrasion resistant structure. The polyester substrate and its coatings include nothing which can be worn out or rendered unusable. No plate made in accordance with the invention has ever shown signs of wear on the conductive surface or the substrate, no matter how many impressions were made with it. The silicate coating likewise is long-lasting and when evenly applied enable runs of 100,000 imprints to be readily achieved.

The polyester substrate 12 of the film F was about 0.005 inch so that the resulting plate is of the order of 0.006 inch in the tests made. The plates were thus quite thin and could be wrinkled if carelessly handled. Without sacrifice of any of the physical or electrostatic properties, a slightly thicker polyester substrate could be used to decrease the tendency to wrinkle and enable the plate to more readily conform to the cylinder surface of a press.

Other coatings can be applied which will give the desired selective characteristics of hydrophilic for the imaged portions of the surface and hydrophobic for the imaged portions. Such variations are well within the scope of the invention as defined in the appended claims. In the claims which follow, in referring to the treatment the word "coating" is used to mean an actual physical covering as well as the products of a chemical reaction.

What it is desired to secure by Letters Patent of the United States is:

1. A method of making a direct-imaged flexible printing plate suitable for use in offset or the like lithographic printing from an electrophotographic member of the type which comprises a thin flexible polymer substrate having a thin, transparent ohmic layer deposited thereon and a high gain, sensitive, photoconductive coating is sputtered, wholly inorganic, uniformly vertically oriented crystalline, flexible, transparent, dense and provides an abrasion-resistant surface, the coating having a dark resistivity of at least $10^{12}$, a ratio of light to dark resistivity of at least $10^4$ and being electrically anisotropic, which method comprises:

charging the surface of the electrophotographic member in darkness, immediately thereafter exposing the surface to a radiation projected image to form a latent image of charge on said surface, toning the surface to develop the latent image with a hydrophobic toner and forming a hydrophilic surface coating on the non-imaged areas of the photoconductive coating by treating the toned coating surface with a material directly forming the hydrophilic surface layer on the non-imaged areas.

2. The method as claimed in claim 1 in which the toner is fixed after toning and before said last-mentioned treating step.

3. The method as claimed in claim 1 in which the toned image is removed after treating together with any treatment material which may have adhered thereto.

4. The method as claimed in claim 1 in which the toner is soluble in a solvent which has no effect upon the material used to treat the surface and is removed from the imaged areas together with any of said material that may have adhered thereto by application of said solvent after treatment.

5. The method as claimed in claim 1 in which the material with which the said surface is treated comprises a material from the group consisting of a silicate polymer, a sodium aluminum hydroxide complex, a potassium ferrocyanide-reacted etch and polyvinyl alcohol rendered insoluble in water.

6. The method as claimed in claim 2 in which the material with which the said surface is treated comprises a material from the group consisting of a silicate polymer, a sodium aluminum hydroxide complex, a potassium ferrocyanide-reacted etch and polyvinyl alcohol rendered insoluble in water.

7. The method as claimed in claim 3 in which the material with which the said surface is treated comprises a material from the group consisting of a silicate polymer, a sodium aluminum hydroxide complex, a potassium ferrocyanide-reacted etch and polyvinyl alcohol rendered insoluble in water.

8. The method as claimed in claim 4 in which the material with which the said surface is treated comprises a material from the group consisting of a silicate polymer, a sodium aluminum hydroxide complex, a potassium ferrocyanide-reacted etch and polyvinyl alcohol rendered insoluble in water.

9. The method as claimed in claim 1 in which the material with which said surface is treated comprises a silicate polymer of the group consisting of sodium silicate, potassium silicate and mixtures thereof.

10. The method as claimed in claim 2 in which the material with which said surface is treated comprises a silicate polymer of the group consisting of sodium silicate, potassium silicate and mixtures thereof.

11. The method as claimed in claim 3 in which the material with which said surface is treated comprises a silicate polymer of the group consisting of sodium silicate, potassium silicate and mixtures thereof.

12. The method as claimed in claim 4 in which the material with which said surface is treated comprises a silicate polymer of the group consisting of sodium silicate, potassium silicate and mixtures thereof.

13. The method as claimed in claim 9 in which the silicate is an aqueous solution from 0.1 to 10% by volume of a 40° to 42° Baume stock solution.

14. The method as claimed in claim 10 in which the silicate is an aqueous solution from 0.1 to 10% by volume of a 40° to 42° Baume stock solution.

15. The method as claimed in claim 11 in which the silicate is an aqueous solution from 0.1 to 10% by volume of a 40° to 42° Baume stock solution.

16. The method as claimed in claim 12 in which the silicate is an aqueous solution from 0.1 to 10% by volume of a 40° to 42° Baume stock solution.

17. The method as claimed in claim 9 in which said material comprises a solution of sodium silicate and the treatment comprises applying a coating to said surface and drying the same.

18. The method as claimed in claim 10 in which said material comprises a solution of sodium silicate and the treatment comprises applying a coating to said surface and drying the same.

19. The method as claimed in claim 11 in which said material comprises a solution of sodium silicate and the treatment comprises applying a coating to said surface and drying the same.

20. The method as claimed in claim 12 in which said material comprises a solution of sodium silicate and the treatment comprises applying a coating to said surface and drying the same.

21. The method as claimed in claim 17 in which at least a second coating is applied after the first dries.

22. The method as claimed in claim 18 in which at least a second coating is applied after the first dries.

23. The method as claimed in claim 19 in which at least a second coating is applied after the first dries.

24. The method as claimed in claim 20 in which at least a second coating is applied after the first dries.

25. A printing plate comprising

A. an electrophotographic member having a thin, flexible, substrate; a thin transparent ohmic layer deposited on the substrate; and a high gain, sensitive, photoconductive coating upon the ohmic layer which is sputtered, wholly inorganic, oriented crystalline, flexible, transparent, dense, has an abrasion resistant surface, has a dark resistivity of at least $10^{12}$ ohm centimeters, a ratio of dark to light resistivity of at least $10^4$ and is electrically anisotropic, B. an image on said latter surface providing imaged and non-imaged areas on said surface, said imaged areas being hydrophobic, and C. a surface coating of hydrophilic material non-removably adhered only to said non-imaged areas of said photoconductive coating.

26. A printing plate as claimed in claim 25 in which the image is in the form of hydrophobic toner adhered to said surface.

27. A printing plate as claimed in claim 25 in which the image is characterized by the absence of toner.

28. A printing plate as claimed in claim 26 in which the toner is permanently adhered.

29. A printing plate as claimed in claim 26 in which the toner is removable.

30. The printing plate as claimed in claim 25 in which said hydrophilic coating comprises a material from the group consisting of a silicate polymer, a sodium aluminum hydroxide complex, a ferrocyanide-reacted substance and insoluble polyvinyl alcohol.

31. The printing plate as claimed in claim 25 in which said hydrophilic coating comprises a silicate polymer of the group consisting of sodium silicate, potassium silicate and mixtures thereof.

32. The printing plate as claimed in claim 25 in which said hydrophilic coating comprises sodium silicate.

33. The printing plate as claimed in claim 28 in which said hydrophilic coating comprises a material from the group consisting of a silicate polymer, a sodium aluminum hydroxide complex, a ferrocyanide-reacted substance and insoluble polyvinyl alcohol.

34. The printing plate as claimed in claim 28 in which said hydrophilic coating comprises a silicate polymer of the group consisting of sodium silicate, potassium silicate and mixtures thereof.

35. The printing plate as claimed in claim 28 in which said hydrophilic coating comprises sodium silicate.

* * * * *